United States Patent [19]

Faust

[11] 4,248,958
[45] Feb. 3, 1981

[54] PHOTOPOLYMERIZABLE MIXTURE CONTAINING POLYURETHANES

[75] Inventor: Raimund J. Faust, Wiesbaden, Fed. Rep. of Germany

[73] Assignee: Hoechst Aktiengesellschaft, Fed. Rep. of Germany

[21] Appl. No.: 41,808

[22] Filed: May 23, 1979

[51] Int. Cl.³ .................. G03C 1/68; C08G 18/00
[52] U.S. Cl. .................. 430/288; 204/159.16; 204/159.19; 430/281; 430/905; 430/906; 525/127
[58] Field of Search .................. 96/115 R, 115 P; 204/159.14, 159.16, 159.19, 159.18; 525/127; 430/281, 284, 288, 905, 906

[56] References Cited

U.S. PATENT DOCUMENTS

| | | | |
|---|---|---|---|
| 3,469,982 | 9/1969 | Celeste | 96/35.1 |
| 3,526,504 | 9/1970 | Celeste | 96/35.1 |
| 3,782,961 | 1/1974 | Takahashi et al. | 204/159.14 |
| 3,844,790 | 10/1974 | Chang et al. | 96/86 P |
| 3,850,770 | 11/1974 | Juna | 96/115 P |
| 3,862,920 | 1/1975 | Foster et al. | 260/42.52 |
| 3,907,574 | 9/1975 | Yonezawa et al. | 96/115 R |
| 3,951,657 | 4/1976 | Recchia | 204/159.15 |
| 4,019,972 | 4/1977 | Faust | 204/159.15 |
| 4,078,015 | 3/1978 | Leitheiser et al. | 260/77.5 CR |
| 4,088,498 | 5/1978 | Faust | 204/159.15 |
| 4,116,786 | 9/1978 | Hadakowski | 204/159.16 |
| 4,139,436 | 2/1979 | Jasani | 204/159.19 |

FOREIGN PATENT DOCUMENTS 1441108 6/1976 United Kingdom .

OTHER PUBLICATIONS

Derwent Japanese Patent Report, vol. 74, No. 4, 26.2, (1974).

Primary Examiner—Jack P. Brammer
Attorney, Agent, or Firm—James E. Bryan

[57] ABSTRACT

This invention relates to a photopolymerizable mixture comprising a polymeric binder which is soluble or swellable in aqueous-alkaline solutions, a photoinitiator, a compound with at least two terminal acrylic or methacrylic acid ester groups and a boiling point above 100° C. which is capable of addition polymerization, and a polyurethane corresponding to the following Formula I

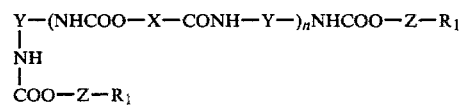

wherein
—X— is one of the following groups:

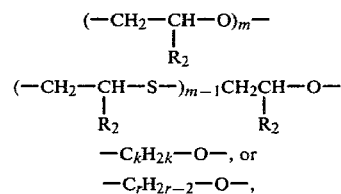

$-C_kH_{2k}-O-$, or $-C_rH_{2r-2}-O-$,

Y is a saturated aliphatic or cycloaliphatic group with 2 to 12 carbon atoms,
Z is

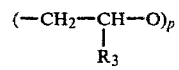

$R_1$ is $R_4$ or $CONH-R_4$,
$R_2$ and $R_3$ are hydrogen atoms or methyl groups,
$R_4$ is a saturated aliphatic group with 1 to 20 carbon atoms,
n is zero or a whole number from 1 to 15,
m is a whole number from 2 to 4,
p is zero or a whole number from 1 to 4,
k is a whole number from 2 to 12,
r is a whole number from 4 to 12,
n+p is a whole number from 1 to 19, and wherein $R_1$ is $R_4$ if p=0, and $R_1$ is $CONH-R_4$ if n=0.

The invention also relates to a light-sensitive transfer material including the photopolymerizable mixture.

10 Claims, No Drawings

PHOTOPOLYMERIZABLE MIXTURE CONTAINING POLYURETHANES

The present invention relates to a photopolymerizable mixture comprising polymeric binders, polymerizable compounds, and photoinitiators.

Mixtures of this type are used in the reproduction field for the manufacture of printing plates, photoresists, i.e. etching and electroplating resists, and relief images which may be colored.

A particular group of such mixtures adapted for the production of photoresists is used in the form of a dry, photopolymerizable layer on a temporary support consisting of a transparent, flexible plastic film. Under the influence of pressure and heat, the layer is laminated to a metal support which is to be imagewise modified, e.g. a copper plate, and is then exposed and developed to form the photoresist. Preferably, the layers should be capable of being developed with aqueous, usually aqueous-alkaline developer solutions. Materials of this type and methods of processing them are disclosed, e.g., in U.S. Pat. Nos. 3,526,504, 3,469,982, 4,088,498, and 4,019,972.

If they are developed with aqueous-alkaline solutions, the layers disclosed in the above-mentioned patents have a specially good adhesion to the support, in particular copper supports, and a good resistance to etching solutions and electroplating baths.

The binders required for these materials which must be soluble or at least swellable in aqueous-alkaline solutions, frequently have the drawback that they impart a certain brittleness to the exposed layer. This is particularly true in the case of binders containing monomer units which impart to the polymer a higher glass transition temperature and which are thus preferred, because they prevent a cold flow of the unexposed layer. Binders of this type are disclosed, e.g., in U.S. Pat. No. 3,930,865.

Monomers containing more than two polymerizable groups in the molecule, which otherwise are particularly advantageous because their exposure products have a high cross-linking density, normally also yield relatively brittle exposure products, especially if exposure is prolonged beyond the optimum exposure time.

Certain compounds containing urethane groups in their molecules have proved particularly suitable as monomeric or polymerizable compounds which are readily compatible with the above-mentioned binders and possess other properties which are of advantage for photoresist techniques. Polymerizable compounds of this type are disclosed in the above-mentioned patents. Due to their higher number of acrylic ester groups or their relatively low molecular weight, the compounds disclosed in U.S. Pat. No. 4,088,498, which invariably contain two urethane groups in their molecules, produce a high cross-linking density and thus layers which tend to be brittle after exposure. Higher molecular weight compounds of this type produce layers which tend to have a lower light-sensitivity and lower resistance to developer solutions.

The compounds containing biuret groups, which are disclosed in U.S. Pat. No. 4,019,972, also have a tendency towards forming relatively brittle exposure products. The compounds with four urethane groups and one polyether group in the molecule, which are also described in this patent, still have a certain resemblance to the compounds containing two urethane groups.

Generally, it can be stated that photopolymerizable layers which have a satisfactorily low degree of cold flow in the unexposed state and which, after exposure, show good adhesion to metal supports, good resistance to developer solutions, and good resistance to etching solutions and electroplating baths, form relatively brittle exposure products. Because this applies particularly to overexposures, usually there is only a very narrow exposure latitude for processing such layers, if optimum combinations of properties are to be achieved. A further embrittlement may occur during storage or handling of the products at daylight.

This increased brittleness of the exposed and even of the unexposed photoresist layers may cause considerable difficulties in the further processing of these layers, e.g. in the production of printed circuits. One of these difficulties is that the brittle resist layer tends to form flakes when the copper circuit boards laminated to the dry resist are cut, thus leading to serious contamination and interference with the further processing of the material. As another drawback, the brittle resist overhangs tend to break off during etching in conventional spray etching apparatuses, or fine details of the photomasks crack off in aggressive electroplating baths, especially in gold baths in which the current yield is relatively low (e.g. from 45 percent down to 25 percent). In this case, hydrogen is formed which may easily cause a cracking of brittle resist masks.

Although the described problems have not been clearly outlined before for this combination of layer components and processing conditions, the question of the brittleness of photopolymerizable layers has been studied in principle, and it was recommended to solve the problem by adding plasticizers to the layers. Thus, in column U.S. Pat. No. 3,844,790, dibutyl phthalate and other esters of aromatic and aliphatic dicarboxylic acids, further glycol esters, polyglycols, alkyl and aryl phosphates, certain sulfonamides, and other compounds are mentioned as suitable plasticizers for certain types of photopolymerizable layers. These, and other similar plasticizers are also mentioned in U.S. Pat. No. 3,192,194, column 4, and in U.S. Pat. No. 3,895,949.

All the plasticizers disclosed in these publications have certain disadvantages when used in photopolymerizable layers of the above type adapted for alkaline development. Many of them are not compatible with the alkyl-soluble binders required and ooze out from the exposed or unexposed layer during storage. Others may have a good plasticizing effect and be compatible, but produce layers with excessive cold-flow in the unexposed state. Still others cause an undesirable reduction of the developer resistance of the exposed areas of the layer, of their resistance to electroplating baths, or their adhesion to the metallic support.

Furthermore, it is known from German Offenlegungsschrift No. 2,361,986, and British Pat. No. 1,464,942 to add certain saturated urethane compounds of similar structure to polymerizable urethanes or polyurethanes and to harden the mixtures by irradiation with ultraviolet light. Allegedly, softer, more flexible light hardening products are thus produced. The mixtures are used for the production of hardenable varnishes or for the production of printing plates. In the latter case, no polymeric binder, and especially no alkali-soluble binder is present in addition to the components already mentioned. Consequently, organic solvents are used for development. The compounds described in detail in these publications cannot be used for the production of solid layers capable of aqueous-alkaline development. Above all, the compounds are unsuitable for the production of layers which display no cold-flow in the unexposed state while their exposure products are sufficiently resistant to developer and electroplating solutions.

It is the object of the present invention to provide a photopolymerizable mixture which produces solid, flexible layers capable of aqueous-alkaline development, which have a high light-sensitivity and low cold-flow, and whose exposure products have a good adhesion to metals, especially to copper, a high resistance to aqueous-alkaline developer solutions, acid etching solutions, and electroplating baths, and maintain their flexibility even after considerable overexposure.

The object of the present invention is a photopolymerizable mixture comprising a polymeric binder which is soluble or swellable in aqueous-alkaline solutions, a photoinitiator, and a compound with at least two terminal acrylic acid or methacrylic acid ester groups and a boiling point above 100° C. which is capable of addition polymerization.

The mixture according to the present invention additionally contains a polyurethane corresponding to the following Formula I

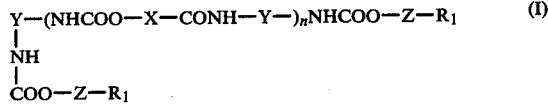

wherein
—X— is one of the following groups:

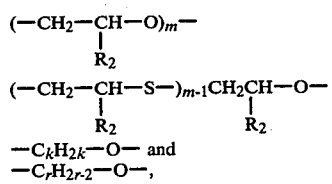
—$C_kH_{2k}$—O— and
—$C_rH_{2r-2}$—O—,

Y is a saturated aliphatic or cycloaliphatic group with 2 to 12 carbon atoms,
Z is the group

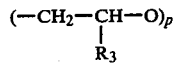

$R_1$ is $R_4$ or —CONH—$R_4$,
$R_2$ and $R_3$ are hydrogen atoms or methyl groups,
$R_4$ is a saturated aliphatic group with 1 to 20 carbon atoms,
n is zero or a whole number from 1 to 15,
m is a whole number from 2 to 4,
p is zero or a whole number from 1 to 4,
k is a whole number from 2 to 12,
r is a whole number from 4 to 12, and
n+p is a whole number from 1 to 19, and wherein $R_1 = R_4$ if p=0, and $R_1$ =CONH—$R_4$ if n=0.

The mixtures according to the present invention normally contain between 5 and 40 percent by weight, preferably between 10 and 35 percent by weight, calculated on the weight of their non-volatile components, of compounds corresponding to Formula I. Generally, from 0.2 to 2, preferably from 0.5 to 1.2 parts by weight of compounds according to Formula I per part by weight of polymerizable compounds are present in the mixtures according to the invention.

On the average, the compounds according to Formula I contain at least 4 urethane groups in their molecules. Their average molecular weights generally range from about 500 to 8,000, and preferably from 900 to 6,000. The lower molecular weight compounds are viscous liquids; higher molecular weight compounds are solid.

Among the compounds corresponding to Formula I, those are preferred in which n is a whole number between 1 and 11. Compounds in which n=5 or more are preferably combined with low molecular weight polymerizable compounds. Both the polymerizable diurethanes obtained from 1 mole of diisocyanate and 2 moles of hydroxy alkyl methacrylate or -acrylate disclosed in U.S. Pat. No. 4,088,498, and the polymerizable tetraurethanes obtained from 1 mole of diol or polyether diol, 2 moles of diisocyanate, and 2 moles of hydroxyalkylacrylate or methacrylate known from U.S. Pat. No. 4,019,972 are suitable for this purpose.

The compounds corresponding to Formula I may be used in the form of the pure compounds with an exactly defined uniform value for n. In practice, however, they will in most cases be in the form of mixtures of homologous compounds whose molecular weights and values for n will vary around a mean value, depending upon the manner of their preparation which will be described hereinafter. If reference is made in the following to certain values for n or to tetraurethanes, e.g. those mixtures of homologous compounds are always included which have corresponding mean values and which approximately correspond to the value stated. The mean values for n or for the molecular weights may be calculated, with an accuracy which is sufficient for practical purposes, from the quantity of reaction partners used, without exactly ascertaining the molecular weight of the product obtained.

The diol group X in the above general formula I may be derived from a saturated or from a singly unsaturated diol. Suitable saturated diols are linear and branched compounds with 2 to 12 carbon atoms, preferably 4 to 12 carbon atoms.

Examples of suitable diols are: ethylene glycol, propylene glycol, butane-diol-(1,4), but-2-enediol-(1,4), 2-ethyl-hexanediol-(1,6), decanediol-(1,10), and 1,4-bis-hydroxymethylcyclohexane.

The diol group X may further contain oxygen or sulfur atoms in its chain. Polyglycol groups, especially polyethylene glycol groups with 1 to 3 ether bonds, are preferred. Triethylene glycols are preferably used as the diol component.

The group Y which is derived from the diisocyanate used for the preparation, is a saturated aliphatic or cycloaliphatic group with 2 to 12, preferably 6 to 12 carbon atoms. Acrylic aliphatic diisocyanates are preferred, in particular those with at least one lateral methyl group. 2,2,4-trimethyl-hexamethylenediisocyanate is a particularly advantageous compound.

$R_1$ preferably is the same as the group $R_4$ and $R_2$ and $R_3$ preferably are hydrogen atoms.

As a rule, the novel polyurethanes containing saturated terminal groups are prepared in two steps. First, the diol component HO—X—OH is reacted with the desired quantity of diisocyanate OCN—Y—NCO. If 3 moles of diisocyanate are reacted with 2 moles of diol, an intermediate product with 2 terminal isocyanate groups is obtained which on the average contains 3 diisocyanate units and 2 diol units, i.e. a compound in which n=2. Then the terminal isocyanate groups are caused to react with the selected alcohol or ether alcohol. By this process, normally polymer homologous mixtures are produced, i.e. mixtures of compounds in which the value for n varies. This applies particularly to those mixtures in which the mean values of n are relatively high. Such mixtures are excellently suitable for the purposes of the present invention and may be immediately used. If it is desired to obtain products with a more exactly defined or at least less varying molecular weight, it is also possible for the above-mentioned diisocyanate intermediate product to be step-wise prepared, by first reacting 1 mole of diol with 2 moles of diisocyanate, then reacting the reaction product with 2 moles of diol, and so on. The intermediate products containing two terminal hydroxyl groups are analogously prepared, by reacting a diisocyanate with the desired diol in excess. Then the terminal OH groups are caused to react with an appropriate monoisocyanate.

The mixtures according to the present invention yield photopolymerizable layers of high light-sensitivity and good flexibility which have only a very slight tendency towards cold flow or no cold flow tendency at all. The exposure products are distinguished by high flexibility and good resistance to aqueous-alkaline developer solutions and to etching solutions and electroplating baths. In addition, they have all the advantages of the known mixtures containing alkali-soluble binders and urethane group-containing monomers. It is particularly surprising that, by adding the non-polymerizable polyurethanes according to the invention, it is not only possible to reduce the cold flow of the unexposed layer but also to improve flexibility of the exposure products, as compared with layers containing the hitherto known polymerizable urethanes. The desired combination of properties which normally are difficult to reconcile with each other is even maintained if the layer is substantially overexposed, so that the consumer is spared the expensive and troublesome task of exactly determining the optimum exposure time for each original and each light source used.

The photopolymerizable mixtures according to the present invention further contain polymeric, preferably thermoplastic binders which are soluble or at least swellable in aqueous-alkaline solutions. Polymers of this type contain groups which form salts in an alkaline medium, e.g. COOH, PO$_3$H$_2$, SO$_3$NH$_2$, SO$_2$NHCO, or OH groups. Polymers containing carboxyl groups are preferred. Maleic acid resins, polymers of N-(p-toluenesulfonyl)-carbamic acid-($\beta$-methacryloyloxy)-ethyl ester, and copolymers of such monomers, further styrene-maleic acid anhydride-copolymers and in particular, acrylic and methacrylic acid copolymers may be used as binders. The latter compounds may contain alkyl acrylates and alkyl methacrylates as comonomers, of which at least some have alkyl groups with 4 to 15 carbon atoms, and, additionally, styrene, substituted styrene, acrylonitrile, benzyl acrylate, or a similar monomer forming a homopolymer with a glass transition temperature Tg of at least 80° C. Such preferred binders are disclosed in U.S. Pat. Nos. 3,804,631 and 3,930,865. The binder should have an average molecular weight of at least 10,000, preferably of about 20,000 to 200,000. Normally, the acid number is between 50 and 250, preferably between 100 and 200. Terpolymers of methacrylic acid, an alkyl-methacrylate with 4 to 12 carbon atoms in the alkyl group, and styrene or substituted styrene are preferred. As a rule, the binder content is in the range from 20 to 80 percent by weight, preferably between 35 and 65 percent by weight of the non-volatile components of the mixture.

Advantageously, the mixtures according to the present invention may contain certain plasticizers which add to the substantial improvement of the flexibility of the layers after exposure. These plasticizers which are described in detail in simultaneously filed application Ser. No. 044,742, filed May 23, 1979, are compounds corresponding to the following Formula II

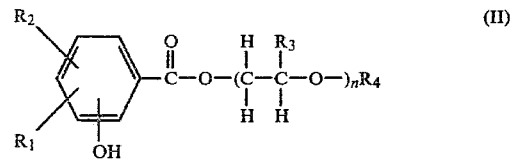

wherein
$R_1$ is a hydrogen or halogen atom or an alkyl group with 1 to 4 carbon atoms,
$R_2$ is a hydrogen atom, an OH group, or an alkyl group with 1 to 4 carbon atoms,
$R_3$ is a hydrogen atom or a methyl group,
$R_4$ is an alkyl or alkenyl group with 1 to 20 carbon atoms, and
n is zero or a whole number from 1 to 20, preferably from 1 to 4, and wherein
$R_4$ has at least 4 carbon atoms if n is zero or 1.

As a rule, the plasticizers are added in a quantity of up to 30 percent by weight, preferably between 10 and 25 percent by weight, calculated on the weight of the non-volatile components of the mixture.

Furthermore, the mixtures according to the invention include polymerizable compounds with at least 2 acrylic or methacrylic acid ester groups in the molecule. Compounds of this type are known in large numbers and are conventionally used for the preparation of photopolymerizable compositions. Examples of suitable compounds are e.g.: ethylene glycol diacrylate, di-, tri- and polyethyleneglycol-diacrylates, hexanediol-(1,6)-diacrylate, trimethylolpropane-triacrylate, trimethylolethane-diacrylate, pentaerythritoltriacrylate, neopentylglycol diacrylate, diglycerol diacrylate, and the corresponding methacrylates. Acrylic and methacrylic acid amides, e.g. methylene-bis-acrylamide, hexamethylene-bis-acrylamide, or xylylene-bis-methacrylamide, also may be used in combination with the esters. Acrylic and methacrylic acid esters containing at least two urethane groups in their molecules are preferred, because these monomers form exposure products which are distinguished by their good flexibility and adhesion to metals. The compounds may also include biuret groups and, if desired, carboxylic acid amide groups. Compounds of this type are disclosed in U.S. Pat. Nos. 4,088,498, 4,019,972, 3,850,770. Reaction products of 2 moles of hydroxyalkyl acrylate or -methacrylate and 1 mole of a diisocyanate, e.g. hexamethylene-diisocyanate, 2,2,4-trimethyl-hexamethylene-diisocyanate, isophoron-diisocyanate, dicyclohexyl-methane-diisocyanate, or tolylene-diisocyanate, are mentioned as examples. Aliphatic and cycloaliphatic diisocyanates with 2 to 12 carbon atoms are generally preferred, and among these those which contain at least one lateral methyl group. Furthermore, monomers are used with advantage which contain at least one oxyalkylene unit, preferably oxyethylene units, in the molecule. The reaction products of hydroxyl group-containing acrylates and methacrylates with diisocyanates produced by the partial reaction of the above-mentioned simple diisocyanates, with diols, e.g. hexane diol, diethyleneglycol, triethylene glycol, pentaethylene glycol, tripropylene glycol and the like, are mentioned as examples. These compounds with terminal isocyanate groups may contain one or more diol or polyether groups.

Polymerizable compounds obtained by reaction of the above-mentioned preferred diisocyanates with di-, tri-, or tetra-ethyleneglycol, in a molar ratio from 2:1 to 1.1:1, followed by reaction of the resulting reaction product with 1 mole of 2-hydroxyethyl methacrylate per equivalent of isocyanate groups, are particularly preferred.

For the preferred application of the mixtures according to the invention in the preparation of dry resist films, the methacrylates are generally preferred. Polymerizable compounds containing two terminal polymerizable double bonds are particularly preferred. As a rule, the monomers are used in quantities ranging from 10 to 50 percent by weight, preferably from 15 to 40 percent by weight, calculated on the weight of the non-volatile components of the mixture.

A great number of substances may be used as photoinitiators. Benzoin, benzoin ether, multi-nuclear quinones, e.g. 2-ethyl-anthraquinone, acridine derivatives, e.g. 9-phenyl-acridine, 9-p-methoxyphenyl-acridine, 9-acetyl-amino-acridine or benz(a)acridine, phenazine derivatives, e.g. 9,10-dimethyl-benz(a)phenazine, 9-methyl-benz(a)phenazine, 10-methoxy-benz(a)phenazine, quinoxaline derivatives, e.g. 6,4',4''-trimethoxy-2,3-diphenyl-quinoxaline or 4',4''-dimethoxy-2,3-diphenyl-5-aza-quinoxaline, quinazoline derivatives, and others are mentioned as examples. As a rule, their quantity is in the range from 0.1 to 10 percent of the weight of the non-volatile components of the mixture.

In addition to the urethanes according to Formula I, polymerizable compounds, photoinitiators, binders, and, if desired, plasticizers, the mixture according to the present invention may include a number of further conventional additives, such as inhibitors to prevent thermal polymerization of the monomers, adhesion-promoting agents, hydrogen donors, sensitometric regulators, dyes, colored or uncolored pigments, color couplers and indicators.

Advantageously, these additives should be selected in a manner such that they do not excessively absorb within the actinic wave length range essential for the initiating process.

The photopolymerizable mixture according to the present invention may be marketed in known manner as a solution or dispersion, which the consumer uses in particular for the preparation of etch resists. Preferably, however, the mixtures according to the invention are used for preparation of dry resist films which consist of a ready-made photoresist layer on a temporary support, e.g. a transparent plastic film. Such dry resist films are laminated by the consumer to the support on which an image is to be formed by etching or electroplating and are then exposed and developed in situ, the temporary support being removed before development.

The mixture according to the present invention is particularly suitable for this type of use. Alternatively, it may be manufactured as a presensitized copying material on a suitable support, e.g. aluminum or zinc, for the photomechanical production of offset or letterpress printing forms. Moreover, it is suitable for the production of relief images, screen printing stencils, color proofing films and the like. The advantages of the present material are effective in all cases where good and lasting flexibility of the exposed layer, low cold flow of the unexposed layer, and high resistance of the exposed layer to aggressive chemicals are of importance.

The light-sensitive materials containing the mixture according to the present invention are prepared in known manner. Thus, a solvent may be added to the mixture and the resulting solution or dispersion may be applied to the support by casting, spraying, immersion, roller application, or some other method, and the resulting film dried. Thicker layers (e.g. of 250 μm or more) may be prepared, as a self-supporting film, by extrusion or molding and the film is then laminated to the support.

Suitable supports for the copying layers containing the mixtures according to the invention are metals, e.g. aluminum, zinc, copper, steel, chromium, brass, and other metal alloys, further supports for screen printing stencils, e.g. nickel or perion gauze, and, plastic films, e.g. polyester films, especially surface-treated plastic films.

The copying layers according to the invention are exposed and developed in the conventional manner. Suitable developers are aqueous, preferably aqueous-alkaline solutions, e.g. alkali phosphate or alkali silicate solutions, to which, if desired, small quantities, e.g. up to 10 percent by weight, but preferably less than 5 percent by weight, of water-miscible organic solvents or wetting agents may be added. Development may be effected by manual treatment, or by treatment in commercial spray development or brush development apparatuses.

As already mentioned, the mixtures according to the present invention may be used for very different purposes. As a particularly advantageous application, they are used for the production of photoresist or etch resist layers on metal supports. They are particularly suitable for use on copper supports. In this preferred application, the excellent adhesion and flexibility of the exposed areas of the layer are of advantage not only during development, but also during the subsequent etching of the support wherein the layers display good flexibility and etch resistance.

The mixtures may be used and handled with particular advantage in the form of the so-called dry resist materials mentioned above, because even dry layers are capable of being transferred onto metal supports and forming firmly adhering layers thereon. In this case, polyester films may be used with particular advantage as temporary supporting films.

In the following examples, some embodiments of the inventive mixture are described. Unless stated otherwise, percentages and proportions are by weight.

EXAMPLE 1

6.5 g of a terpolymer of n-hexylmethacrylate, methacrylic acid, and styrene (60 : 30 : 10) with an average molecular weight of about 35,000, 2.8 g of the saturated polyurethane described below, 2.8 g of a polymerizable polyurethane obtained by first reacting 2 moles of 2,2,4-trimethylhexamethylenediisocyanate with 1 mole of anhydrous triethyleneglycol and then reacting the resulting reaction product with 2 moles of hydroxyethyl methacrylate, 2.8 g of 4-hydroxy-(2-ethyl-hexyl)-benzoate, 0.2 g of 9-phenyl-acridine,
0.1 g of 3-mercapto-propionic acid-2,4-dichloroanilide, and
0.025 g of the dye called "Disperse Red" (Color Index No. 179)

are dissolved in 25.0 g of methyl ethyl ketone and
2.0 g of ethanol and the resulting solution is whirler-coated onto a 25 μm thick, biaxially stretched and heat-set polyethylene terephthalate film in a manner such that, after drying at 100° C., the layer weighs 49 g/m².

The dry resist film thus produced is laminated by means of a commercial laminating apparatus, at 120° C., to a laminated phenoplast panel provided with a 35 μm thick copper foil and is then exposed for 14 seconds by means of a commercial exposure device. The master used is a line original in which the lines and the distances between lines have widths down to 80 μm.

After exposure, the polyester film is stripped off and the layer is developed within 70 seconds in a 0.8 percent $Na_2CO_3$ solution in a spray developing apparatus.

The plate is then rinsed for 30 seconds with tap water, superficially etched for 1 minute with a 25 percent ammonium peroxy disulfate solution, and then successively electroplated in the following electroplating baths:

1. For 40 minutes in a copper bath marketed by Messrs. Blasberg, Solingen, Germany, under the designation "Feinkornkupferplastic-Bad". Current density: 2 A/dm²; Thickness of the metal deposition: approximately 20 μm.

2. For 10 minutes in a nickel bath of type "Norma" marketed by Messrs. Blasberg, Solingen. Current density: 4 A/dm²; Thickness of the metal deposition: 6 μm.

3. For 15 minutes in a gold bath of type "Autronex N" marketed by Messrs. Blasberg, Solingen. Current Density: 0.6 A/dm²; Thickness of the metal deposition: 2.5 μm.

The plate shows no undercutting or damage.

The plate then may be decoated in a 5 percent KOH solution a 50° C. and the bared copper areas may be etched away by conventional etching means.

Even after 11-times overexposure, i.e. after an exposure time of 160 seconds in the above-described exposure apparatus, the above described dry resist film is completely flexible. This can be proved by manually stretching an about 2 cm wide and 20 cm long strip of the exposed material consisting of support and layer. At room temperature, the 11-times overexposed strip of dry resist film can be stretched to at least twice its original length without cracking or tearing of the layer.

This flexibility is of decisive importance for many processing steps, such as cutting of the laminated material, etching, gold-plating and others. Furthermore, the above-described dry resist film has a very low cold flow in the unexposed state, so that rolls can be stored for long periods of time without the resist layer squeezing out at the edges.

By means of the above-described layer, lines of a width of 50 μm can be resolved with sharp edges, as can be easily proved by exposing the material under a resolution test original and developing it with a 0.8 percent $Na_2CO_3$ solution. The developer resistance corresponds to at least 3-times the developing time.

The polyurethane used in this example is prepared as follows:

2 moles of 2,2,4-trimethyl-hexamethylene-diisocyanate in 800 g of methyl ethyl ketone are filled into a three-necked flask provided with stirrer, reflex condenser with $CaCl_2$-drying tube, and dropping funnel. After adding a mixture of 1.5 g of iron(III)-acetyl-acetonate and
2.0 g of diethyl cyclohexyl amine, in
50.0 g of methyl ethyl ketone, which acts as a catalyst, a solution of 1 mole of anhydrous triethyleneglycol in 50 g of methyl ethyl ketone is cautiously added in a manner such that a constant reaction temperature of 70°±1° C. is maintained. For this purpose, a water bath is provided which first has a temperature of 60° C., so that it heats the mixture from the outside, and after the desired interior temperature has been attained by the heat generated by the polyaddition reaction, the same bath—which now has a temperature between about 40° C. and 50° C.—serves to cool the reaction mixture. When the entire triethyleneglycol solution has been introduced, 2 moles of triethyleneglycol-mono-butylether are dropwise added at 70° C. After completion of the reaction, the mixture is stirred for 2 hours at 70° C. and then cooled. The resulting polyurethane may be added to the polymerizable mixtures either in the form of the solution or as a resin, after the solvent has been distilled off. In the examples, the polyurethanes are used in the form of the resins.

EXAMPLE 2

The saturated polyurethane used in Example 1 may be replaced by the same quantity (2.8 g) of a polyurethane which is prepared analogously by reacting 4 moles of 2,2,4-trimethyl-hexamethylene diisocyanate first with 3 moles of triethyleneglycol (first reaction step) and then with 2 moles of triethyleneglycol-monobutylether (second reaction step).

A dry resist film is prepared in a manner analogous to that described in Example 1. The resist layer has a weight of 53 g/m² and is still stretchable and flexible after 10-times overexposure. The resistance of the layer to the electroplating baths used in Example 1 is excellent.

EXAMPLE 3

The saturated polyurethane used in Example 1 may be replaced by the same quantity (2.8 g) of a polyurethane which is prepared analogously to the method described in Example 1, by reacting 2 moles of 2,2,4-trimethyl-hexamethylene-diisocyanate first with 1 mole of butene-(2)-diol-(1,4) (first reaction step) and then with 2 moles of diethyleneglycol-mono-2-ethylhexyl ether (second reaction step).

Details of the resulting dry resist film are as follows:

Layer weight: 51 g/m²
Exposure time: 16 seconds
Development: 80 seconds/0.8% $Na_2CO_3$ solution
Test results: similar to those of Example 1.

EXAMPLE 4

The saturated polyurethane used in Example 1 may be replaced by the same quantity (2.8 g) of a polyurethane which is prepared by reacting 2 moles of 2,2,4-trimethyl-hexamethylene-diisocyanate first with 1 mole of thiodiethyleneglycol (first reaction step) and then with 2 moles of diethyleneglycol-mono-2-ethylhexyl ether (second reaction step).

A dry resist film with a layer weight of 53 g/m² is thus obtained whose test results are similar to those of Example 1.

EXAMPLE 5

The saturated polyurethane used in Example 1 may be replaced by the same quantity (2.8 g) of a polyurethane which is prepared by adding
1 mole of 2,2,4-trimethyl-hexamethylene-diisocyanate to 2 moles of triethyleneglycol (first reaction step), and then reacting the resulting product with 2 moles of octadecyl-monoisocyanate (second reaction step).

A dry resist film with a layer weight of 53 g/m² is obtained whose test results are similar to those of Example 1.

EXAMPLE 6

6.5 g of the terpolymer used in Example 1,
2.8 g of a polymerizable diurethane obtained from 1 mole of 2,2,4-trimethyl-hexamethylene-diisocyanate, and 2 moles of hydroxy-ethyl-methylacrylate,
2.8 g of the 4-hydroxy-benzoic acid ester of diethyleneglycol-mono-n-hexyl ether,
0.2 g of 9-phenyl-acridine,
0.1 g of 3-mercapto-propionic acid-2,4-dichloroanilide,
0.025 g of the dye used in Example 1,
2.8 g of a saturated polyurethane prepared analogously to the method described in Example 1, by reacting 11 moles of 2,2,4-trimethyl-hexamethylene-diisocyanate first with 10 moles of triethyleneglycol (first reaction step) and then with 2 moles of diethyleneglycol-mono-2-ethyl-hexyl ether (second reaction step)

are dissolved in 35.0 g of methyl ethyl ketone and
2.0 g of ethanol and the resulting solution is processed as described in Example 1 to form a dry resist film in which the layer on the polyester film weighs 52 g/m² after drying.

When this dry resist film is tested as described in Example 1, it is found that, as regards its resistance to electroplating baths and the flexibility of the exposed and 10-times overexposed resist layer, the film is similar to that obtained by Example 1.

EXAMPLE 7

The saturated polyurethane used in Example 6 may be replaced by the same quantity (2.8 g) of a polyurethane which is analogously prepared by reacting
2 moles of 2,2,4-trimethyl-hexamethylene-diisocyanate first with 1 mole of butane-diol-(1,4) (first reaction step) and then with 2 moles of triethyleneglycol-monobutyl ether (second reaction step).

The resulting dry resist film has a layer weight of 52 g/m² and its test results are comparable to those of the film according to Example 6. Even after 6-times overexposure, the flexibility of the resist layer is still good, so that the layer does not tear or crack when a test strip of the material is stretched.

EXAMPLE 8

6.5 g of the terpolymer used in Example 1,
2.8 g of the polymerizable polyurethane used in Example 1,
2.8 g of 4-hydroxy-(2-ethyl-hexyl)-benzoate,
0.1 g of 3-mercapto-propionic acid-2,4-dichloroanilide,
0.2 g of 9-phenyl-acridine,
0.025 g of the dye used in Example 1, and
2.8 g of a saturated polyurethane obtained by reacting 2 moles of 2,2,4-trimethyl-hexamethylene-diisocyanate with 1 mole of triethyleneglycol (first reaction step) and then reacting the reaction product with 2 moles of diethyleneglycol-mono-2-ethyl-hexyl-ether (second reaction step), are dissolved in 25.0 g of methyl ethyl ketone and
2.0 g of ethanol, and a dry resist film with a layer weight of 52 g/m² is prepared from the solution as described in Example 1.

After lamination, exposure (15 seconds) and development (100 seconds in an 0.8 percent $Na_2CO_3$ solution), a resist mask is obtained which is excellently resistant to the electroplating baths used in Example 1. The flexibility of the 11-times over-exposed resist film (160 seconds exposure time) is still excellent.

EXAMPLE 9 (COMPARATIVE EXAMPLE)

If the mixture of 2.8 g of the polymerizable diurethane and 2.8 g of the saturated polyurethane used in Example 6 is replaced by 5.6 g of the polymerizable diurethane, while the other components of the layer remain the same, a dry resist layer weighing 52 g/m² is obtained which has about the same light-sensitivity, but a considerably greater tendency to become brittle by overexposure. With normal exposure time, the layer is flexible; after double the exposure time, i.e. about 30 seconds, and increasingly with exposure times above 40 seconds, using the exposure apparatus mentioned in Example 1, the layer becomes brittle and no longer can be stretched without tearing or splintering. Moreover, the layer displays a substantially higher flowing tendency at room temperature than the layer described in Example 6, which leads to an undesirable squeezing out of the layer when the material is stored in the form of rolls of dry resist film, e.g. rolls of 50 m length. The layer according to Example 6 shows no undesirable squeezing out of the resist layer during storage, a fact which can be attributed to the considerably lower cold flow of this layer.

It will be obvious to those skilled in the art that many modifications may be made within the scope of the present invention without departing from the spirit thereof, and the invention includes all such modifications.

What is claimed is:

1. A photopolymerizable mixture comprising a polymeric binder which is soluble or swellable in aqueous-alkaline solutions, a photoinitiator, a compound with at least two terminal acrylic or methacrylic acid ester groups and a boiling point above 100° C. which is capable of addition polymerization, and between 5 and 40 percent by weight, based on the weight of non-volatile components of the mixture, of a polyurethane corresponding to the following Formula I

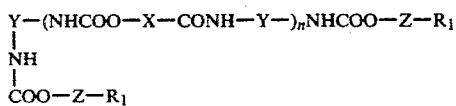

wherein

—X— is one of the following groups:

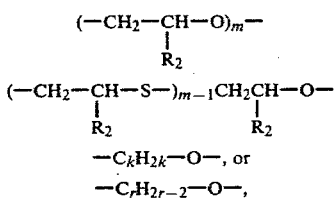

—$C_kH_{2k}$—O—, or

—$C_rH_{2r-2}$—O—,

Y is a saturated aliphatic or cycloaliphatic group with 2 to 12 carbon atoms,

Z is

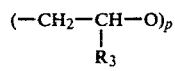

$R_1$ is $R_4$ or CONH—$R_4$, $R_2$ and $R_3$ are hydrogen atoms or methyl groups, $R_4$ is a saturated aliphatic group with 1 to 20 carbon atoms, n is zero or a whole number from 1 to 15, m is a whole number from 2 to 4, p is zero or a whole number from 1 to 4, k is a whole number from 2 to 12, r is a whole number from 4 to 12, n+p is a whole number from 1 to 19, and wherein $R_1$ is $R_4$ if p=0, and $R_1$ is CONH—$R_4$ if n=0.

2. A photopolymerizable mixture according to claim 1 in which in the compound corresponding to Formula I, n is a whole number from 1 to 11.

3. A photopolymerizable mixture according to claim 1 in which in the compound corresponding to Formula I, X is the group

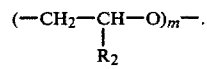

4. A photopolymerizable mixture according to claim 3 in which in the compound corresponding to Formula I, $R_2$ is a hydrogen atom.

5. A photopolymerizable mixture according to claim 4 in which in the compound corresponding to Formula I, m=3.

6. A photopolymerizable mixture according to claim 1 in which in the compound corresponding to Formula I, $R_3$ is a hydrogen atom.

7. A photopolymerizable mixture according to claim 1 in which in the compound corresponding to Formula I, Y is a saturated aliphatic group with at least one lateral methyl group.

8. A photopolymerizable mixture according to claim 1 in which the compound capable of addition polymerization has at least two urethane groups in its molecule.

9. A photopolymerizable mixture according to claim 1 in which the binder is an acrylic or methacrylic acid copolymer with an acid number between 50 and 250.

10. A photopolymerizable mixture according to claim 9 in which the copolymer is a terpolymer of methacrylic acid, an alkyl methacrylate with 4 to 15 carbon atoms in the alkyl group, and a further monomer which can be copolymerized with the first two components and whose homopolymer has a glass transition temperature of at least 80° C.

* * * * *